US011877483B2

(12) United States Patent
Lee et al.

(10) Patent No.: US 11,877,483 B2
(45) Date of Patent: Jan. 16, 2024

(54) DISPLAY DEVICE WITH CIRCUIT FILM COUPLED TO LATERAL SURFACE OF BASE SUBSTRATE

(71) Applicant: Samsung Display Co., Ltd., Yongin-si (KR)

(72) Inventors: Donghyun Lee, Asan-si (KR); Si Joon Song, Suwon-si (KR); Eui Jeong Kang, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 226 days.

(21) Appl. No.: 17/187,109

(22) Filed: Feb. 26, 2021

(65) Prior Publication Data

US 2021/0359072 A1    Nov. 18, 2021

(30) Foreign Application Priority Data

May 18, 2020  (KR) .......................... 10-2020-0059263

(51) Int. Cl.
*H10K 59/131*    (2023.01)
*H10K 50/842*    (2023.01)

(52) U.S. Cl.
CPC ....... *H10K 59/131* (2023.02); *H10K 50/8426* (2023.02)

(58) Field of Classification Search
CPC ............ H01L 27/3276; H01L 51/5246; H10K 59/131; H10K 50/8426
See application file for complete search history.

(56) References Cited

U.S. PATENT DOCUMENTS

| | | | |
|---|---|---|---|
| 10,281,780 B2 | 5/2019 | Furuta | |
| 10,451,934 B2 | 10/2019 | Furuta | |
| 2014/0043855 A1* | 2/2014 | Kang | G02B 6/0083 362/612 |
| 2017/0357121 A1* | 12/2017 | Cho | G02F 1/13452 |
| 2017/0358602 A1* | 12/2017 | Bae | G02F 1/13458 |
| 2018/0067353 A1* | 3/2018 | Son | H01L 27/124 |
| 2018/0067354 A1* | 3/2018 | Son | H05K 1/111 |
| 2018/0088388 A1* | 3/2018 | Furuta | G02F 1/13452 |
| 2019/0049771 A1* | 2/2019 | Ye | H01L 27/1266 |
| 2019/0109288 A1 | 4/2019 | Li et al. | |
| 2019/0204652 A1* | 7/2019 | Lee | G02F 1/136286 |
| 2019/0206784 A1* | 7/2019 | Oh | H01L 27/3276 |
| 2019/0278123 A1* | 9/2019 | Lee | H01L 25/18 |
| 2020/0004093 A1* | 1/2020 | Yoo | H01L 23/482 |
| 2021/0028267 A1* | 1/2021 | Kang | H10K 59/131 |

FOREIGN PATENT DOCUMENTS

| | | | |
|---|---|---|---|
| JP | 2010-237405 A | 10/2010 | |
| KR | 10-2017 0139217 A | 12/2017 | |
| KR | 10-1993340 B1 | 6/2019 | |
| KR | 10-2010852 B1 | 8/2019 | |

* cited by examiner

*Primary Examiner* — Lex H Malsawma
(74) *Attorney, Agent, or Firm* — Lewis Roca Rothgerber Christie LLP

(57) ABSTRACT

A display device includes a display module including a first base substrate and a pad on a top surface of the first base substrate; a circuit film coupled to a lateral surface of the first base substrate and including a contact pad spaced apart from the pad; and a conductive member on the top surface of the first base substrate and in contact with the pad and the contact pad.

19 Claims, 16 Drawing Sheets

DISPLAY DEVICE WITH CIRCUIT FILM COUPLED TO LATERAL SURFACE OF BASE SUBSTRATE

CROSS-REFERENCE TO RELATED APPLICATION

This application claims priority to and the benefit of Korean Patent Application No. 10-2020-0059263, filed on May 18, 2020 in the Korean Intellectual Property Office, the entire disclosure of which is hereby incorporated by reference.

BACKGROUND

1. Field

Aspects of the present inventive concept relate to a display device.

2. Description of the Related Art

In general, a display device comprises a display panel including a plurality of pixels and a driver chip for driving the pixels. The driver chip is disposed on a circuit film, and the circuit film is connected to the display panel. The driver chip is connected through the circuit film to the pixels of the display panel. This connection type is defined as a chip-on-film scheme.

The circuit film is provided thereon with a plurality of contact pads connected to the driver chip, and the display panel includes a plurality of pads connected to the pixels. The pads are electrically connected to corresponding contact pads, and, thus, the driver chip is electrically connected to the pixels.

There has recently been studied a structure in which a flexible film is disposed on a lateral surface of the display panel so as to decrease an area of the bezel of the display device and to widen a display region.

SUMMARY

According to an aspect of one or more embodiments of the present inventive concept, a display device including a bezel having a reduced area is provided.

According to another aspect of one or more embodiments of the present inventive concept, a display device with increased reliability of connection between a display module and a circuit film is provided.

According to one or more embodiments of the present inventive concept, a display device comprises: a display module including a first base substrate and a pad on a top surface of the first base substrate; a circuit film coupled to a lateral surface of the first base substrate, the circuit film including a contact pad spaced apart from the pad; and a conductive member on the top surface of the first base substrate and in contact with the pad and the contact pad.

In one or more embodiments, the conductive member may be in contact with a lateral surface of the contact pad, and the lateral surface of the contact pad may face the lateral surface of the first base substrate.

In one or more embodiments, the contact pad may protrude upwards beyond the top surface of the first base substrate.

In one or more embodiments, the conductive member may be in contact with a top surface of the contact pad.

In one or more embodiments, the contact pad may be below a top surface of the pad.

In one or more embodiments, the first base substrate may have a chamfered surface at a corner between the top surface and the lateral surface.

In one or more embodiments, the conductive member may be in contact with the chambered surface.

In one or more embodiments, the display device may further comprise a plurality of partitions that are spaced apart from each other across the pad, and, when viewed in a plan view, the plurality of partitions may not overlap the conductive member.

In one or more embodiments, the display device may further comprise an adhesive member coupling the contact pad to the lateral surface of the first base substrate.

In one or more embodiments, the display device may further comprise: a second base substrate below the first base substrate; and a sealing member between the first base substrate and the second base substrate, and a lateral surface of the sealing member and a lateral surface of the second base substrate may be coupled to the adhesive member.

In one or more embodiments, the display device may further comprise: a second base substrate on the first base substrate; and a sealing member between the first base substrate and the second base substrate, and the first base substrate may protrude beyond a lateral surface of the second base substrate.

In one or more embodiments, the conductive member may be in contact with a lateral surface of the sealing member.

In one or more embodiments, a width in a first direction of the adhesive member may be less than a width in the first direction of the contact pad.

In one or more embodiments, when viewed in a plan view, the conductive member may overlap the pad, the first base substrate, and the adhesive member.

In one or more embodiments, a thickness of the first base substrate may be less than a width of the contact pad, the width of the contact pad being in a direction parallel to a thickness direction of the first base substrate.

According to one or more embodiments of the present inventive concept, a display device comprises: a display module including a substrate and a pad on a top surface of the substrate; a circuit film coupled to a lateral surface of the display module, the circuit film including a contact pad; an adhesive member coupled to the contact pad and the lateral surface of the display module; and a conductive member electrically connecting the pad to the contact pad, and the conductive member may be on the pad, the substrate, and the adhesive member.

In one or more embodiments, the contact pad may protrude upwards beyond the top surface of the substrate, and the conductive member may be in contact with a top surface of the pad and a lateral surface of the contact pad.

In one or more embodiments, the circuit film may be below a top surface of the pad, and the conductive member may be in contact with the top surface of the pad and a top surface of the contact pad.

In one or more embodiments, a thickness of the substrate may be less than a width of the contact pad, the width of the contact pad being in a direction parallel to a thickness direction of the substrate.

In one or more embodiments, the width of the contact pad may be greater than a width of the adhesive member, the width of the adhesive member being in the direction parallel to the thickness direction of the substrate.

DETAILED DESCRIPTION

Figure 1:
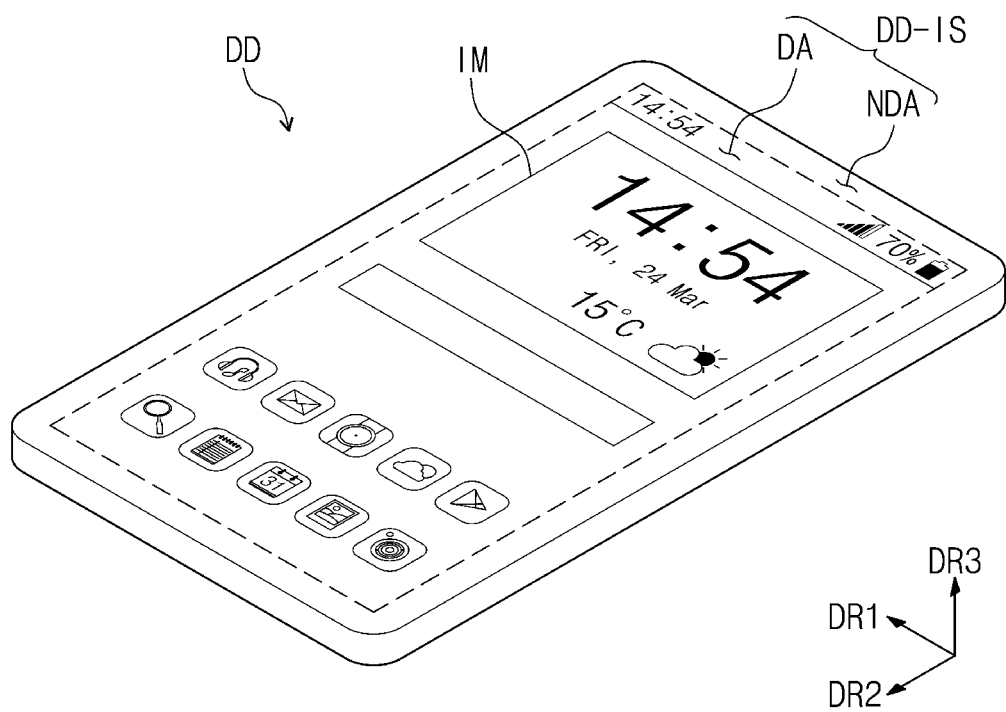
FIG. 1 illustrates a perspective view showing a display device according to some example embodiments of the present inventive concept.

The inventive concepts now will be described more fully herein with reference to the accompanying drawings, in which some example embodiments are shown. The inventive concepts may, however, be embodied in many different forms, and should not be construed as limited to the embodiments set forth herein.

In this description, when a certain component (or region, layer, portion, etc.) is referred to as being "on," "connected to," or "coupled to" other component(s), the certain component may be directly disposed on, directly connected to, or directly coupled to the other component(s) or at least one intervening component may be present therebetween.

Like numerals indicate like components. Further, in the drawings, thicknesses, ratios, and dimensions of components may be exaggerated for effectively explaining the technical contents.

The term "and/or" includes one or more combinations defined by associated components.

It is to be understood that, although the terms "first," "second," etc. may be used herein to describe various components, these components should not be limited by these terms. These terms are used to distinguish one component from another component. For example, a first component could be termed a second component, and vice versa, without departing from the scope of the present inventive concept. Also, unless the context clearly indicates otherwise, singular forms are intended to include the plural forms as well.

In addition, the terms "beneath," "lower," "above," "upper," and the like are used herein to describe one component's relationship to other component(s) illustrated in the drawings. However, the relative terms are intended to encompass different orientations in addition to the orientation depicted in the drawings.

Unless otherwise defined, all terms used herein including technical and scientific terms have the same meaning generally understood by one of ordinary skilled in the art. Also, terms as defined in dictionaries generally used should be understood as having meaning identical or meaning contextually defined in the art and should not be understood as having an ideally or excessively formal meaning unless definitely defined herein.

It is to be understood that the terms "comprise," "include," "have,", and the like are used to specify the presence of stated features, integers, steps, operations, components, elements, or combinations thereof, but do not preclude the presence or addition of one or more other features, integers, steps, operations, components, elements, or combinations thereof.

Some example embodiments of the present inventive concept will now be described in conjunction with the accompanying drawings.

FIG. 1 illustrates a perspective view showing a display device according to some example embodiments of the present inventive concept.

Referring to FIG. 1, a display device DD may be an apparatus that is activated by electrical signals. The display device DD may include any of various embodiments. For example, the display device DD may be used for large-sized electronic apparatuses, such as televisions, monitors, or outdoor billboards, and also used for small and medium-sized electronic apparatuses, such as personal computers, laptop computers, personal digital terminals, automobile navigation units, game consoles, portable electronic devices, or cameras. However, these products are merely presented as examples, and the display device DD may be adopted for any suitable electronic apparatus unless departing from the spirit of the present inventive concept. FIG. 1 shows a mobile phone as an example of the display device DD.

The display device DD may include a display surface DD-IS. The display surface DD-IS may include a display region DA and a non-display region NDA. The display region DA may be a zone on which an image IM is displayed. The image IM may include not only dynamic images but also static images. FIG. 1 shows a clock window and icons as examples of the image IM. The non-display region NDA may be a zone on which the image IM is not displayed. Pixels may be disposed on the display region DA, and pixels may not be disposed on the non-display region NDA. The pixels may indicate effective pixels that provide the image IM.

The display region DA may be parallel to a plane defined by a first direction DR1 and a second direction DR2. A third direction DR3 may be parallel to a normal direction to the display region DA or to a thickness direction of the display device DD. The third direction DR3 may differentiate front and rear surfaces (or top and bottom surfaces) of each member. The third direction DR3 may intersect the first direction DR1 and the second direction DR2. In an embodiment, the first, second, and third directions DR1, DR2, and DR3 may be perpendicular to each other.

The non-display region NDA may define a bezel of the display device DD. The non-display region NDA may be a zone adjacent to the display region DA. In an embodiment, the non-display region NDA may surround the display region DA. The present inventive concept, however, is not limited thereto, and the display region DA and the non-display region NDA may be relatively designed in shape. In some example embodiments of the present inventive concept, the non-display region NDA may be omitted.

The display device DD is illustrated to have a flat display surface DD-IS, but the present inventive concept is not limited thereto. For example, the display device DD may include a curved display surface or a cubic display surface. The cubic display surface may include a plurality of display regions oriented in different directions.

Figure 2:
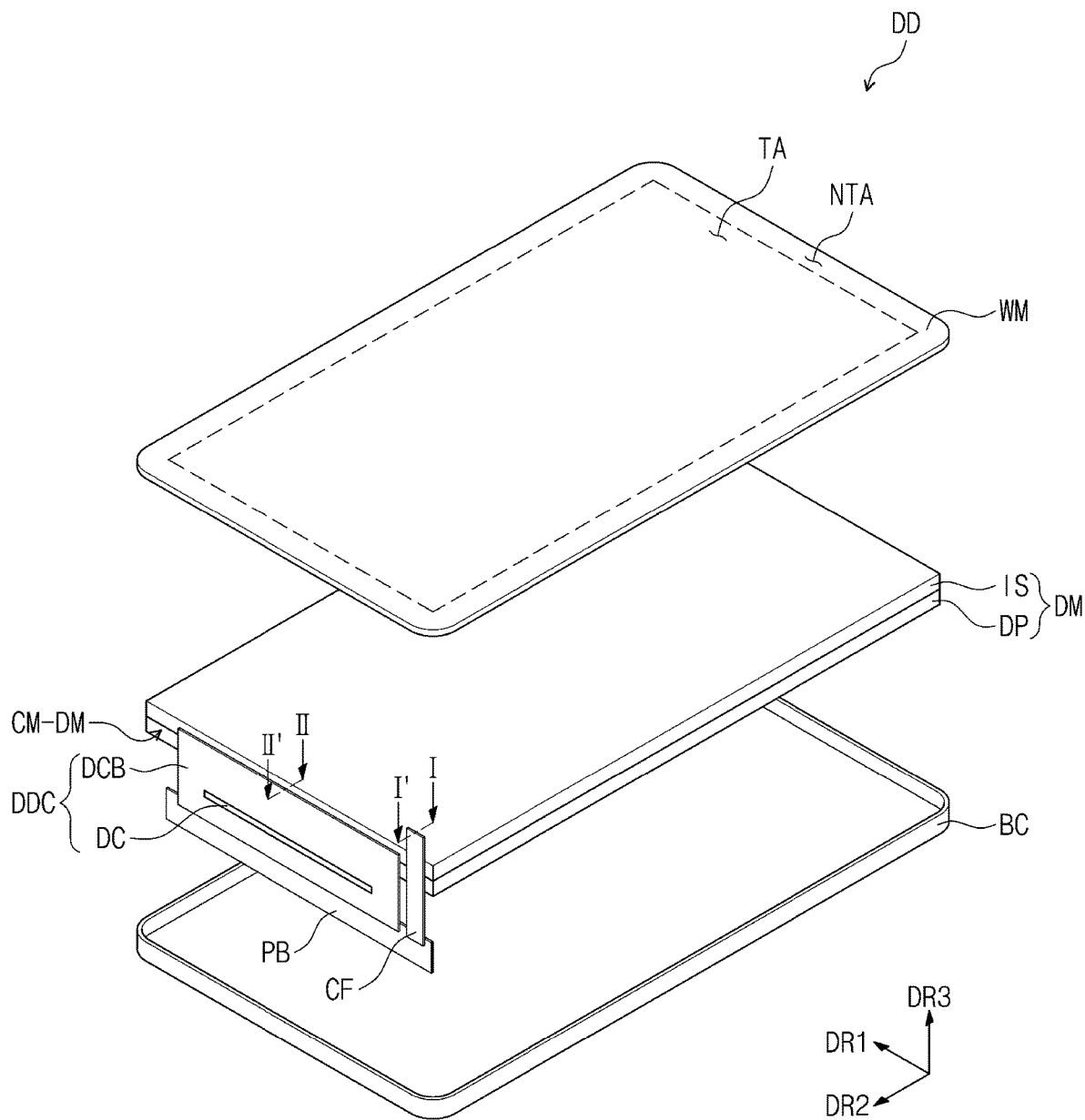
FIG. 2 illustrates an exploded perspective view showing a display device according to some example embodiments of the present inventive concept.

FIG. 2 illustrates an exploded perspective view showing a display device according to some example embodiments of the present inventive concept.

Referring to FIG. 2, the display device DD may include a window WM, a display module DM, a plurality of circuit films DDC and CF, a main circuit board PB, and an accommodation member BC.

The window WM may be disposed on the display module DM, and may externally transmit an image provided from the display module DM. The window WM may include a transmission region TA and a non-transmission region NTA. The transmission region TA may overlap the display region (see DA of FIG. 1), and may have a shape that corresponds to that of the display region DA. The image (see IM of FIG. 1) displayed on the display region DA of the display device DD may be externally visible through the transmission region TA of the window WM.

The non-transmission region NTA may overlap the non-display region (see NDA of FIG. 1), and may have a shape that corresponds to that of the non-display region NDA. The non-transmission region NTA may be a zone having an optical transmittance that is relatively less than that of the transmission region TA. The non-transmission region NTA may overlap the bezel defined on the non-display region NDA of the display device DD. In some example embodiments of the present inventive concept, the non-transmission region NTA may be omitted.

The window WM may include an optically transparent dielectric material. For example, the window WM may include glass or plastic. The window WM may have a multi-layered or single-layered structure. For example, the window WM may include a plurality of plastic films that are coupled to each other through an adhesive, or a glass substrate with a plastic film coupled thereto through an adhesive.

The display module DM may be disposed between the window WM and the accommodation member BC. In an embodiment, the display module DM may display the image IM and may detect an external input. The display module DM may include a display panel DP and an input sensor IS.

The display panel DP may be a component that substantially produces the image IM. The image IM produced from the display panel DP may be externally visible to a user through the transmission region TA.

In an embodiment, the display panel DP may be an emissive display panel, but the present inventive concept is not particularly limited thereto. For example, the display panel DP may be an organic light emitting display panel, a quantum-dot light emitting display panel, or a micro-LED display panel. An emission layer of the organic light emitting display panel may include an organic light emitting material. An emission layer of the quantum-dot light emitting display panel may include a quantum-dot or a quantum-rod. An emission layer of the micro-LED display panel may include a micro-sized LED. These, however, are merely examples, and no limitation is imposed on the type of the display panel DP according to some example embodiments of the present inventive concept.

The input sensor IS may be provided with an external input externally applied. The input sensor IS may detect an external input provided to the window WM.

The plurality of circuit films DDC and CF and the main circuit board PB may be disposed on a lateral surface CM-DM of the display module DM. In comparison with a display device in which a plurality of circuit films are disposed on a top or bottom surface of a display module, the display device DD according to the present inventive concept may have a reduced dead space. The plurality of circuit films DDC and CF and the main circuit board PB may reduce an area of the non-display region NDA. Therefore, the display device DD may have a reduced area of the bezel.

The plurality of circuit films DDC and CF may include a first circuit film DDC and a second circuit film CF. Each of the first and second circuit films DDC and CF may be referred to as a circuit film.

The first circuit film DDC may be electrically connected to the display panel DP. The first circuit film DDC may connect the display panel DP to the main circuit board PB. The display panel DP may have pads (e.g., display pads) disposed on the non-display region NDA, and the first circuit film DDC may be coupled to the pads of the display panel DP. The first circuit film DDC may provide the display panel DP with control signals for driving the display panel DP.

In an embodiment, the first circuit film DDC may include a driver circuit board DCB and a driver chip DC. The driver chip DC may be disposed on the driver circuit board DCB. The driver chip DC may receive the control signals from the main circuit board PB. The driver chip DC may generate drive signals required for driving the display panel DP. The drive signals output from the drive chip DC may be transferred through the driver circuit board DCB to the display panel DP.

The second circuit film CF may be electrically connected to the input sensor IS. The second circuit film CF may connect the input sensor IS to the main circuit board PB.

The input sensor IS may have pads (e.g., input pads) disposed on the non-display region NDA, and the second circuit film CF may be coupled to the pads of the input sensor IS. The second circuit film CF may provide the input sensor IS with electrical signals for driving the input sensor IS. The electrical signals may be generated from the second circuit film CF or the main circuit board PB.

The main circuit board PB may include power supply connectors or various driver circuits for driving the display module DM. The first circuit film DDC and the second circuit film CF may each be coupled to the main circuit board PB. According to some example embodiments of the present inventive concept, the display module DM may be easily controlled by a single main circuit board PB. This configuration, however, is merely an example. For example, the display module DM may be configured such that that display panel DP and the input sensor IS are connected to different main circuit boards, and that one of the first and second circuit films DDC and CF may not be connected to the main circuit board PB, but the present inventive concept is not limited thereto.

The accommodation member BC may be combined with the window WM. The accommodation member BC and the window WM may be coupled to each other to provide an inner space. The inner space may accommodate the display module DM.

The accommodation member BC may include a material having a relatively high rigidity. For example, the accommodation member BC may include a plurality of frames and/or plates consisting of glass, plastic, metal, or a combination thereof. The accommodation member BC may stably protect, from external impact, components of the display device DD that are accommodated in the inner space.

Figure 3A:
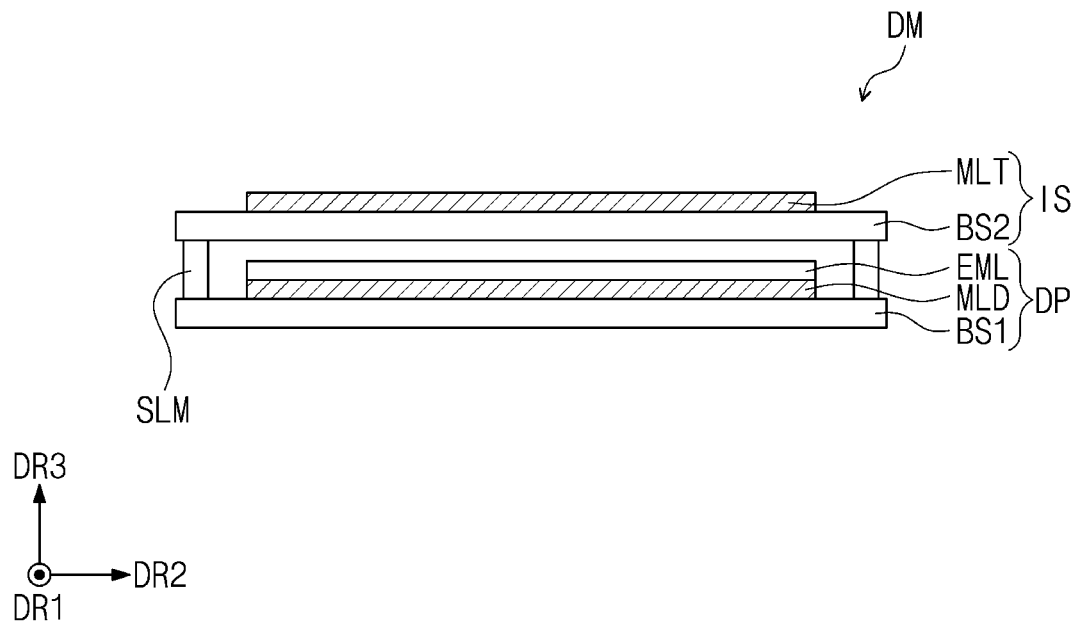
FIG. 3A illustrates a cross-sectional view showing a display module according to some example embodiments of the present inventive concept.

FIG. 3A illustrates a cross-sectional view showing a display module according to some example embodiments of the present inventive concept.

Referring to FIG. 3A, the display module DM may include a display panel DP, an input sensor IS, and a sealing member SLM.

The display panel DP may include a first base substrate BS1, a display circuit layer MLD, and an image implementation layer EML. The input sensor IS may include a second base substrate BS2 and a sensing circuit layer MLT.

In an embodiment, the first base substrate BS1 and the second base substrate BS2 may each be a silicon substrate, a plastic substrate, a glass substrate, a dielectric film, or a stack structure including a plurality of dielectric layers. However, the first base substrate BS1 may be called a second base substrate, and the second base substrate BS2 may be called a first base substrate.

The display circuit layer MLD may be disposed on the first base substrate BS1. The display circuit layer MLD may include a plurality of dielectric layers and a plurality of conductive layers, which conductive layers may constitute signal lines or a pixel control circuit. FIG. 3A shows that the display circuit layer MLD is surrounded by the sealing member SLM, but no limitation is imposed on the arrangement between the display circuit layer MLD and the sealing member SLM according to embodiments of the present inventive concept. For example, when viewed in a plan view, the display circuit layer MLD may be disposed to overlap the sealing member SLM.

The image implementation layer EML may be disposed on the display circuit layer MLD. In an embodiment, the image implementation layer EML may include an organic light emitting diode. This, however, is merely an example, and the image implementation layer EML may include an inorganic light emitting diode, an organic-inorganic light emitting diodes, or a liquid crystal layer, for example.

The second base substrate BS2 may be disposed on, or over, the image implementation layer EML. A space may be defined between the second base substrate BS2 and the image implementation layer EML. In an embodiment, the space may be filled with air or an inert gas. In some example embodiments of the present inventive concept, the space may be filled with a filler, such as a silicone-based polymer, an epoxy-based resin, or an acryl-based resin.

The sensing circuit layer MLT may be disposed on the second base substrate BS2. The sensing circuit layer MLT may include a plurality of dielectric layers and a plurality of conductive layers. The plurality of conductive layers may constitute sensing electrodes that detect external inputs, sensing lines that have electrical connections with the sensing electrodes, and sensing pads that have electrical connections with the sensing lines.

The sealing member SLM may be disposed between the first base substrate BS1 and the second base substrate BS2. The sealing member SLM may connect the first base substrate BS1 to the second base substrate BS2. The sealing member SLM may include an organic material such as a photo-curable resin or a photo-plastic resin, or an inorganic material, such as a frit seal, but the present inventive concept is not limited to a particular embodiment.

Figure 3B:
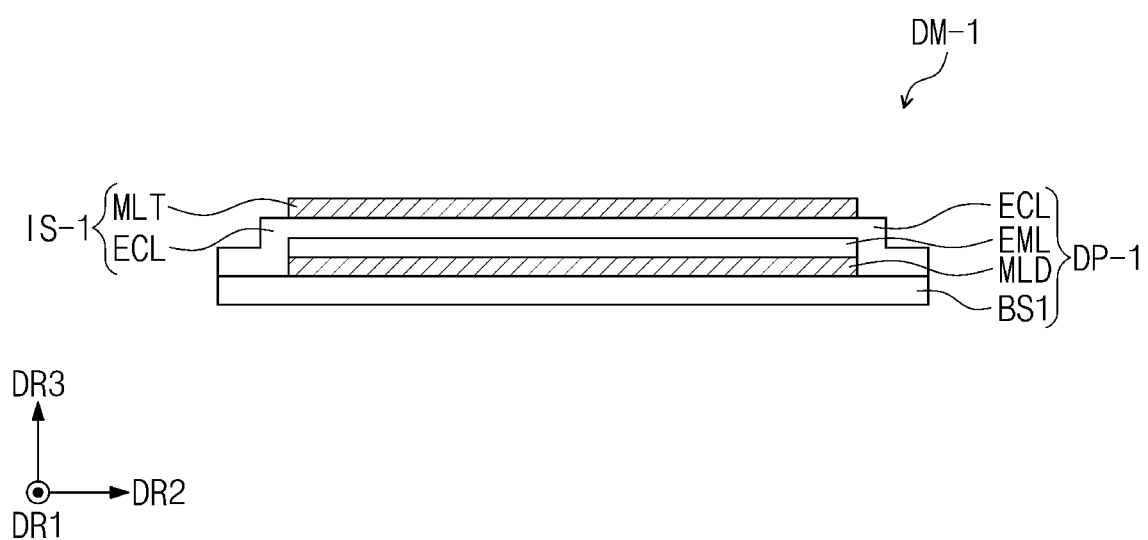
FIG. 3B illustrates a cross-sectional view showing a display module according to some example embodiments of the present inventive concept.

FIG. 3B illustrates a cross-sectional view showing a display module according to some example embodiments of the present inventive concept. In describing FIG. 3B, the same reference symbols are allocated to the components discussed in FIG. 3A, and a repetitive description thereof may be omitted.

Referring to FIG. 3B, a display module DM-1 may include a display panel DP-1 and an input sensor IS-1.

The display panel DP-1 may include a first base substrate BS1, a display circuit layer MLD, an image implementation layer EML, and a thin-film encapsulation layer ECL. The input sensor IS-1 may include a second base substrate ECL and a sensing circuit layer MLT. The thin-film encapsulation layer ECL and the second base substrate ECL may be the same component.

According to some example embodiments of the present inventive concept, the display panel DP-1 and the input sensor IS-1 may be formed in a successive process. For example, the sensing circuit layer MLT may be directly formed on the thin-film encapsulation layer ECL.

The display module DM-1 according to some example embodiments of the present inventive concept may be a flexible display module.

Figure 4:
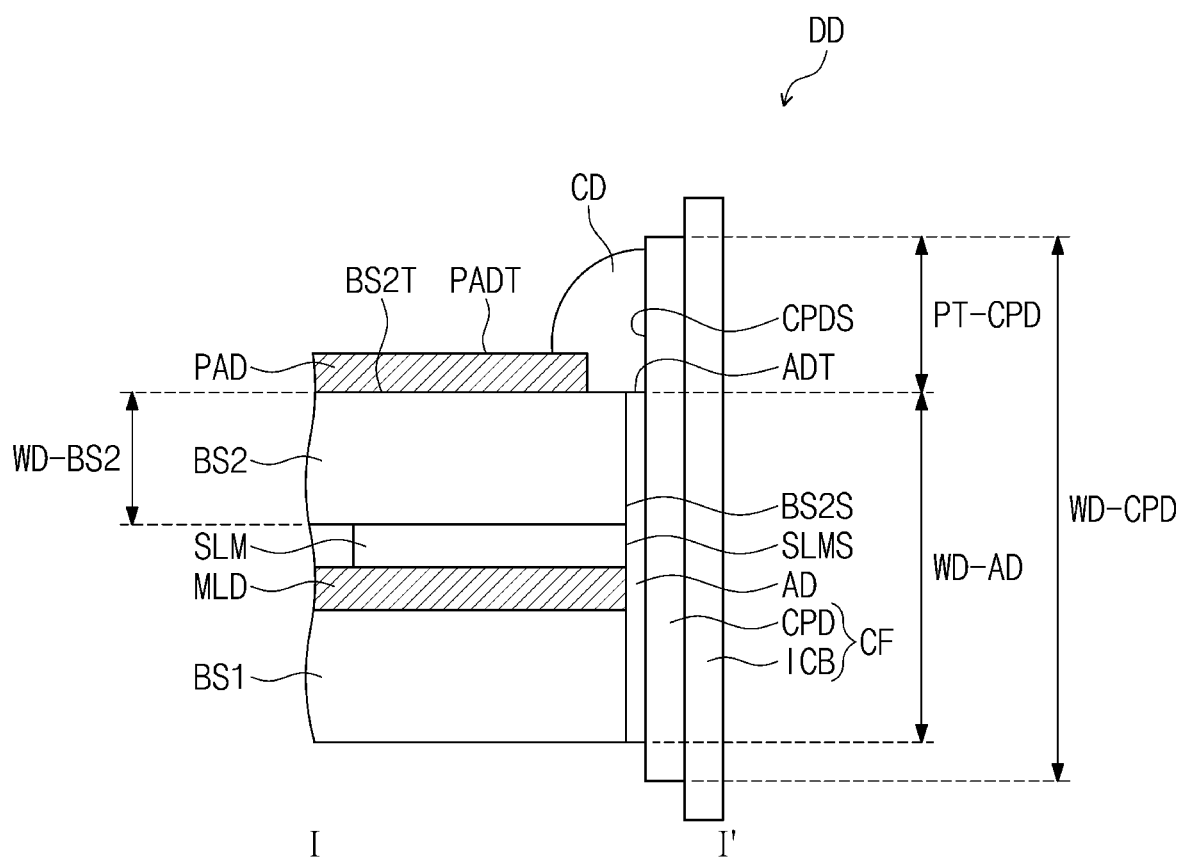
FIG. 4 illustrates a cross-sectional view taken along the line I-I' of FIG. 2, showing a display device according to some example embodiments of the present inventive concept.
Figure 4:
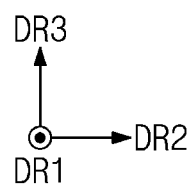

FIG. 4 illustrates a cross-sectional view taken along the line I-I' of FIG. 2, showing a display device according to some example embodiments of the present inventive concept. In describing FIG. 4, the same reference symbols are allocated to the components discussed in FIG. 3A, and a repetitive description thereof may be omitted.

Referring to FIG. 4, the display device DD may include a display module (see DM of FIG. 2), a second circuit film CF, a conductive member CD, which may have a curved external surface, and an adhesive member AD.

An input pad PAD may be disposed on a top surface BS2T of the second base substrate BS2. The input pad PAD may be a portion of the sensing circuit layer (see MLT of FIG. 3A). The input pad PAD may include a same material as that of the sensing circuit layer MLT. In an embodiment, the input pad PAD may include indium tin oxide (ITO) and molybdenum (Mo). This, however, is merely an example, and no limitation is imposed on the material of the input pad PAD according to some example embodiments of the present inventive concept. For example, the input pad PAD may include a material having a structure in which titanium (Ti), aluminum (Al), and titanium (Ti) are sequentially stacked. The input pad PAD may be called a pad.

The second circuit film CF may be coupled to a lateral surface BS2S of the second base substrate BS2. The second circuit film CF may include a contact pad CPD and an input circuit board ICB.

The contact pad CPD may be spaced apart in the second direction DR2 from the input pad PAD. In an embodiment, the contact pad CPD may protrude beyond the top surface BS2T of the second base substrate BS2. For example, the contact pad CPD may protrude as much as a first distance PT-CPD from the top surface BS2T of the second base substrate BS2. The first distance PT-CPD may be in a range from several micrometers (μm) to several hundred micrometers (μm). For example, in consideration of adhesion tolerance, the first distance PT-CPD may be within a range of from about 70 μm to about 80 μm.

The contact pad CPD may have a width WD-CPD in the third direction DR3 greater than a thickness WD-BS2 in the third direction DR3 of the second base substrate BS2. A thickness direction of the second base substrate BS2 may be parallel to the third direction DR3.

In an embodiment, the contact pad CPD may include tin (Sn) and copper (Cu). This, however, is merely an example, and no limitation is imposed on the material of the contact pad CPD according to some example embodiments of the present inventive concept.

The input circuit board ICB may be electrically connected to the contact pad CPD. The input circuit board ICB may be a flexible circuit film. For example, the input circuit board ICB may be bent from the lateral surface CM-DM to a bottom surface of the display module DM shown in FIG. 2. This, however, is merely an example, and no limitation is imposed on the input circuit board ICB according to some example embodiments of the present inventive concept. For example, the input circuit board ICB may be a rigid board.

The conductive member CD may be disposed on the adhesive member AD, the input pad PAD, and the top surface BS2T of the second base substrate BS2. The conductive member CD may contact the input pad PAD and the contact pad CPD. For example, the conductive member CD may contact a top surface PADT of the input pad PAD. The conductive member CD may contact a lateral surface CPDS of the contact pad CPD, which lateral surface CPDS faces the lateral surface BS2S of the second base substrate BS2. The conductive member CD may contact a top surface ADT of the adhesive member AD. The conductive member CD may electrically connect the input pad PAD to the contact pad CPD.

In an embodiment, the conductive member CD may be a solder including tin (Sn). The solder may have self-assembly characteristics to allow the input pad PAD and the contact pad CPD to easily have an electrical connection with each other. This, however, is merely an example, and a conductive material may be included in the conductive member CD according to some example embodiments of the present inventive concept. For example, the conductive member CD may include one or more of metal inks, metal pastes, and metal particles. The metal ink may include a metal and a solvent. The metal paste may include a metal, a binder, and a resin. The metal particle may be provided by a sputtering process or a jetting process.

The adhesive member AD may couple the lateral surface BS2S of the second base substrate BS2, a lateral surface SLMS of the sealing member SLM, and the contact pad CPD. The adhesive member AD may be a resin, an anisotropic conductive film (ACF), or a non-conductive film (NCF). This, however, is merely an example, and a conventional adhesive or glue may be included in the adhesive member AD according to some example embodiments of the present inventive concept. For example, the adhesive member AD may be an epoxy adhesive, a urethane adhesive, or a photo-curable resin.

The adhesive member AD may have a width WD-AD in the third direction DR3 less than the width WD-CPD in the third direction DR3 of the contact pad CPD. However, the third direction DR3 may be referred to as a first direction.

According to some example embodiments of the present inventive concept, a thermal compression process may be used to allow the adhesive member AD to couple the lateral surface BS2S of the second base substrate BS2, the lateral surface SLMS of the sealing member SLM, and the contact pad CPD. This, however, is merely an example, and no limitation is imposed on the manner of coupling between the lateral surface BS2S of the second base substrate BS2, the lateral surface SLMS of the sealing member SLM, and the contact pad CPD. For example, ultrasonic bonding may be employed to couple the lateral surface BS2S of the second base substrate BS2, the lateral surface SLMS of the sealing member SLM, and the contact pad CPD.

In the display device DD according to some example embodiments of the present inventive concept, a first bonding process and a second bonding process may be utilized to couple the second circuit film CF to the lateral surface CM-DM of the display module DM shown in FIG. 2. The first bonding process may use the adhesive member AD to couple the second circuit film CF to the lateral surface BS2S of the second base substrate BS2. The second bonding process may use the conductive member CD to electrically connect the input pad PAD to the contact pad CPD.

According to the present inventive concept, unlike prior processes, a method of fabricating the display device DD may include neither a process for grinding a substrate nor a process for forming a pad on the lateral surface CM-DM of the display module DM, which pad formation process includes a masking process, a metal sputtering process, and a patterning process. Therefore, it may be possible to simplify a fabrication process for the display device DD and to reduce a process time. Moreover, connection lines may be prevented or substantially prevented from being pushed or cracked during the grinding process and from being corroded by a cleaning process after the grinding process, and the display module DM may be prevented or substantially prevented from being damaged due to a laser in the patterning process.

According to the present inventive concept, the adhesive member AD may allow the contact pad CPD of the second circuit film CF to adhere to the lateral surface CM-DM of the display module DM. The input pad PAD and the contact pad CPD may be electrically connected to each other through the conductive member CD. Accordingly, the display device DD including a bezel having a reduced area may be provided.

In addition, according to the present inventive concept, because the input pad PAD is neither disposed to extend onto the lateral surface BS2S of the second base substrate BS2 nor coupled to the contact pad CPD, a pad crack may be prevented or substantially prevented from occurring at a corner that connects the top surface BS2T to the lateral surface BS2S of the second base substrate BS2. Accordingly, it may be possible to increase reliability of connection between the input pad PAD and the contact pad CPD.

Figure 5:
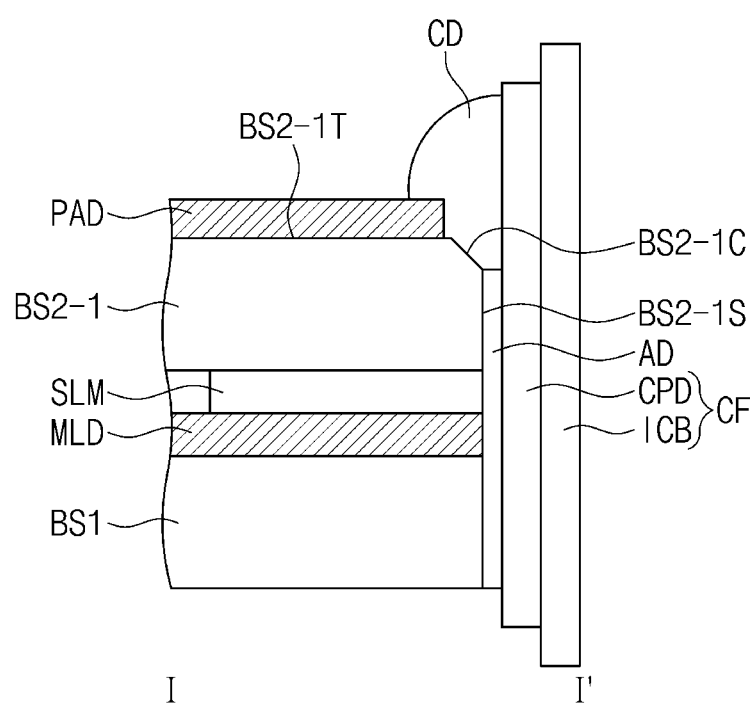
FIG. 5 illustrates a cross-sectional view taken along the line I-I' of FIG. 2, showing a display device according to some example embodiments of the present inventive concept.
Figure 5:
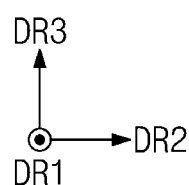
Figure 6:
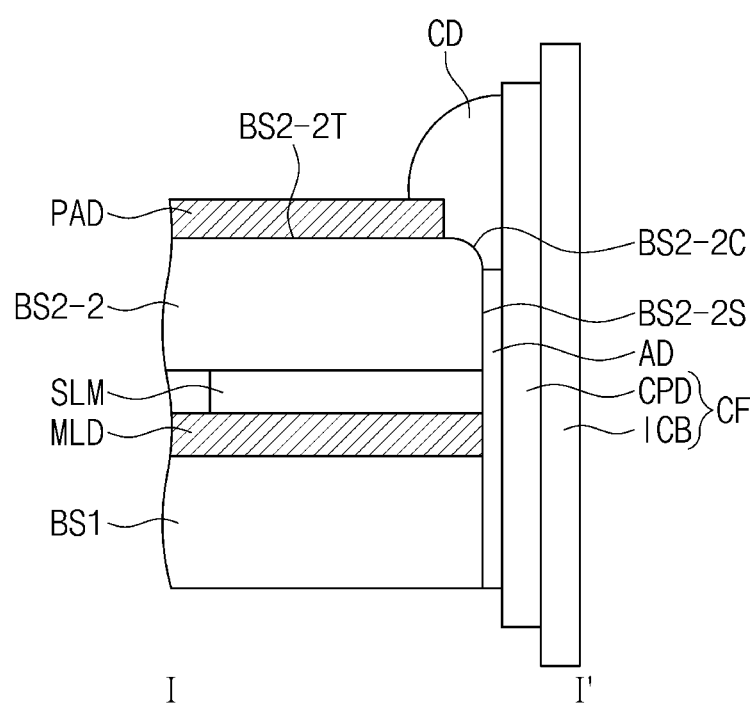
FIG. 6 illustrates a cross-sectional view taken along the line I-I' of FIG. 2, showing a display device according to some example embodiments of the present inventive concept.
Figure 6:
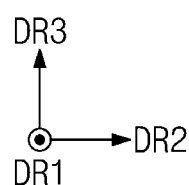

FIGS. 5 and 6 illustrate cross-sectional views taken along the line I-I' of FIG. 2, showing a display device according to some example embodiments of the present inventive concept. In describing FIGS. 5 and 6, the same reference symbols are allocated to the components discussed in FIG. 4, and a repetitive description thereof may be omitted.

Referring to FIG. 5, a second base substrate BS2-1 may have a chamfered surface at a corner between a top surface BS2-1T and a lateral surface BS2-1S of the second base substrate BS2-1. The chamfered surface may be an inclined surface BS2-1C. The inclined surface BS2-1C may connect the top surface BS2-1T to the lateral surface BS2-1S. The inclined surface BS2-1C may be a cut surface of the corner between the top surface BS2-1T and the lateral surface BS2-1S.

The conductive member CD may contact the input pad PAD, the inclined surface BS2-1C, and the contact pad CPD. The conductive member CD may electrically connect the input pad PAD to the contact pad CPD.

According to the present inventive concept, before the second circuit film CF is attached to the display module (see DM of FIG. 2), the inclined surface BS2-1C may reduce the occurrence of a crack at the corner between the top and lateral surfaces BS2-1T and BS2-1S of the second base substrate BS2-1. The inclined surface BS2-1C may easily connect the display module DM to the second circuit film CF. It may thus be possible to increase reliability of connection between the display module DM and the second circuit film CF.

Referring to FIG. 6, a second base substrate BS2-2 may have a chamfered surface at a corner between a top surface BS2-2T and a lateral surface BS2-2S of the second base substrate BS2-2. The chamfered surface may be a curved surface BS2-2C. The curved surface BS2-2C may connect the top surface BS2-2T to the lateral surface BS2-2S. The curved surface BS2-2C may be a cut surface of the corner between the top surface BS2-2T and the lateral surface BS2-2S.

The conductive member CD may contact the input pad PAD, the curved surface BS2-2C, and the contact pad CPD. The conductive member CD may electrically connect the input pad PAD to the contact pad CPD.

According to the present inventive concept, before the second circuit film CF is attached to the display module (see DM of FIG. 2), the curved surface BS2-2C may reduce the occurrence of a crack at the corner between the top and lateral surfaces BS2-2T and BS2-2S of the second base substrate BS2-2. The curved surface BS2-2C may easily connect the display module DM to the second circuit film CF. It may thus be possible to increase reliability of connection between the display module DM and the second circuit film CF.

Figure 7:
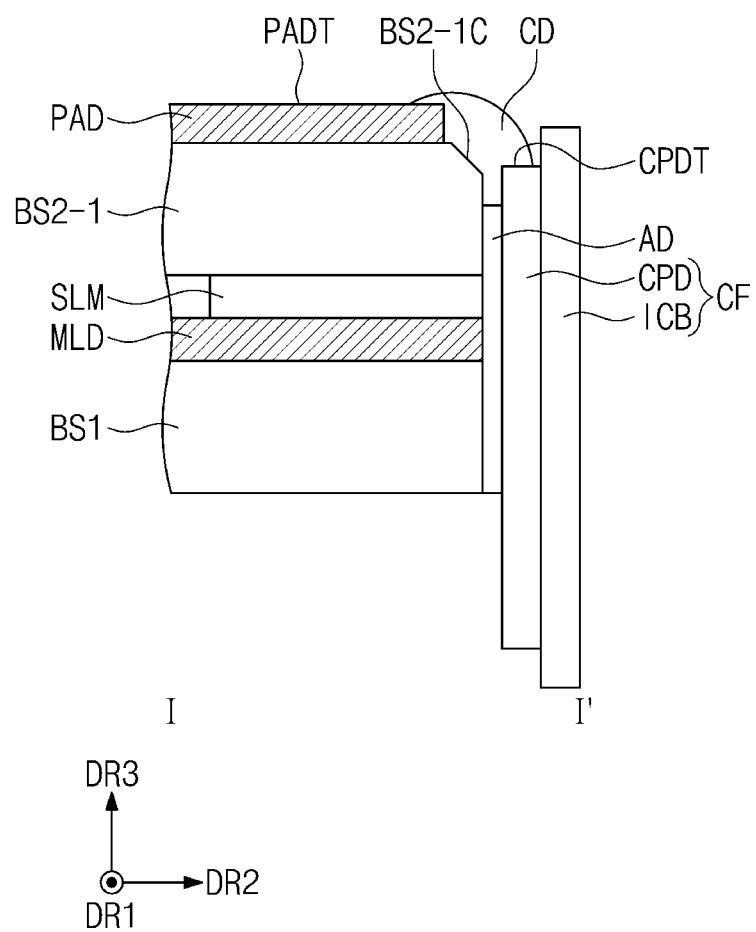
FIG. 7 illustrates a cross-sectional view taken along the line I-I' of FIG. 2, showing a display device according to some example embodiments of the present inventive concept.

FIG. 7 illustrates a cross-sectional view taken along the line I-I' of FIG. 2, showing a display device according to some example embodiments of the present inventive concept. In describing FIG. 7, the same reference symbols are allocated to the components discussed in FIGS. 4 and 5, and a repetitive description thereof may be omitted.

Referring to FIG. 7, the second circuit film CF may be disposed below the top surface PADT of the input pad PAD.

The conductive member CD may contact the input pad PAD, the inclined surface BS2-1C, and the contact pad CPD. The conductive member CD may contact a top surface CPDT of the contact pad CPD. The conductive member CD may electrically connect the input pad PAD to the contact pad CPD.

According to the present inventive concept, the second circuit film CF may not protrude beyond the top surface PADT of the input pad PAD. The second circuit film CF may be prevented or substantially prevented from being damaged due to components disposed on the display module (see DM of FIG. 2) of the display device (see DD of FIG. 1).

Figure 8:
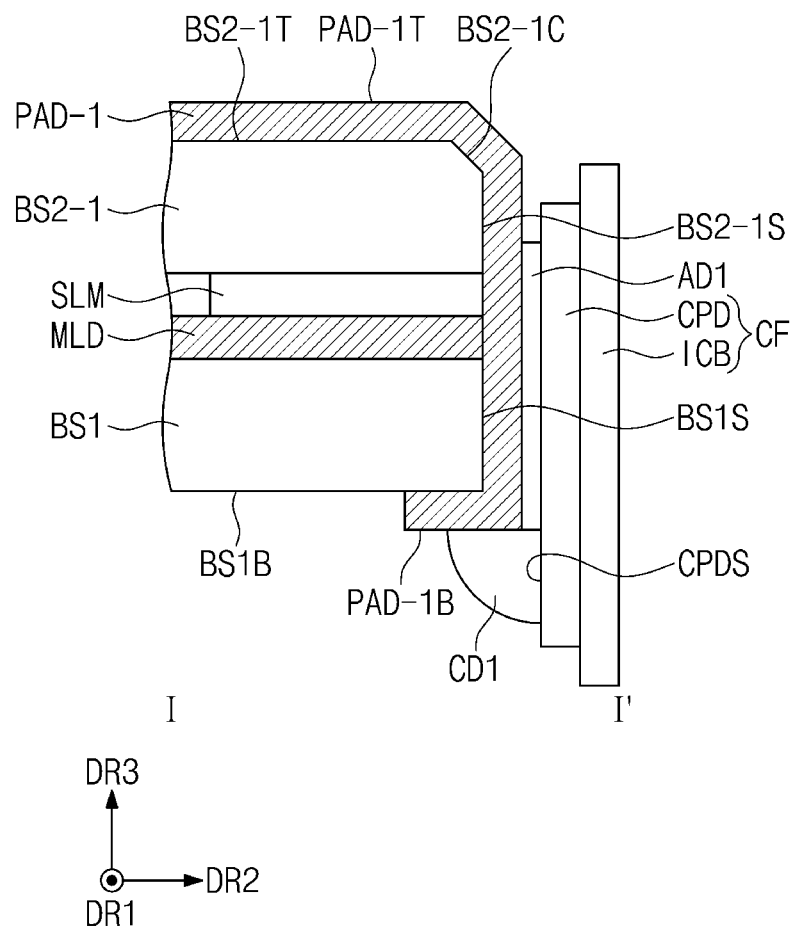
FIG. 8 illustrates a cross-sectional view taken along the line I-I' of FIG. 2, showing a display device according to some example embodiments of the present inventive concept.

FIG. 8 illustrates a cross-sectional view taken along the line I-I' of FIG. 2, showing a display device according to some example embodiments of the present inventive concept. In describing FIG. 8, the same reference symbols are allocated to the components discussed in FIG. 5, and a repetitive description thereof may be omitted.

Referring to FIG. 8, an input pad PAD-1 may be disposed on the top surface BS2-1T, the inclined surface BS2-1C, and the lateral surface BS2-1S of the second base substrate BS2-1, and also on a lateral surface BS1S and a bottom surface BS1B of the first base substrate BS1. The input pad PAD-1 may have a continuous shape.

An adhesive member AD1 may couple the input pad PAD-1 to the second circuit film CF.

A conductive member CD1 may contact a bottom surface PAD-1B of the input pad PAD-1 and the lateral surface CPDS of the contact pad CPD. The conductive member CD1 may electrically connect the input pad PAD-1 to the contact pad CPD.

According to the present inventive concept, the second circuit film CF may not protrude beyond a top surface PAD-1T of the input pad PAD-1. The second circuit film CF may be prevented or substantially prevented from being damaged due to components disposed on the display module (see DM of FIG. 2) of the display device (see DD of FIG. 1).

According to the present inventive concept, the input pad PAD-1 may be disposed to extend from the top surface BS2-1T of the second base substrate BS2-1 to the bottom surface BS1B of the first base substrate BS1. The input pad PAD-1 may have an increased area and a decreased resistance. It may be possible to increase reliability of signals transferred from the input pad PAD-1 to the second circuit film CF.

Figure 9:
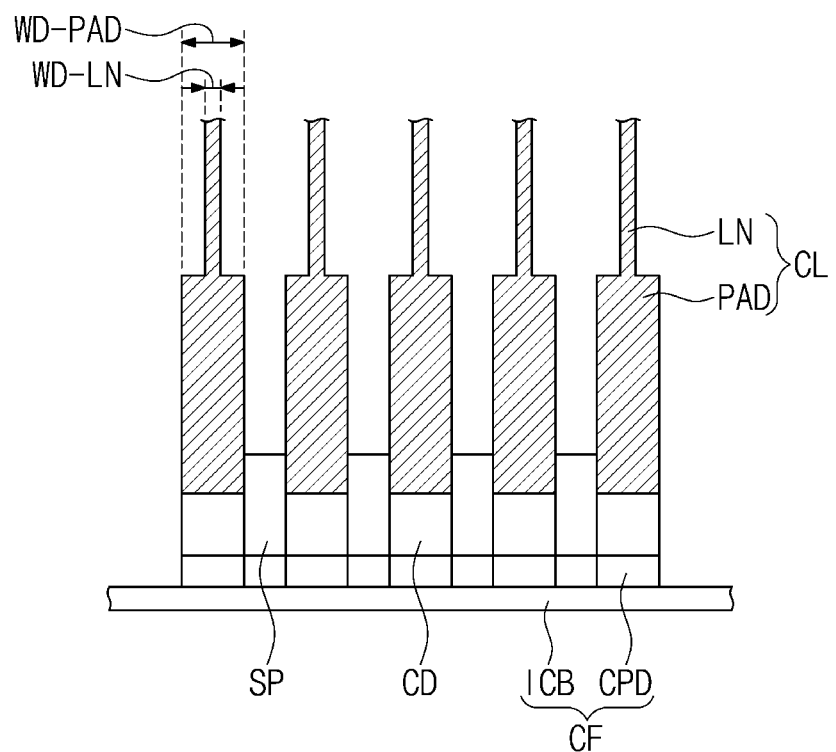
FIG. 9 illustrates a plan view showing a display device according to some example embodiments of the present inventive concept.
Figure 9:
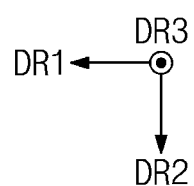

FIG. 9 illustrates a plan view showing a display device according to some example embodiments of the present inventive concept.

Referring to FIG. 9, a plurality of sensing lines CL may extend in the second direction DR2 and may be arranged in the first direction DR1. Each of the plurality of sensing lines CL may include a connection line LN and an input pad PAD. The input pad PAD may extend from the connection line LN. The connection line LN and the input pad PAD may collectively constitute a single unitary body.

The input pad PAD may have a width WD-PAD in the first direction DR1 greater than a width WD-LN in the first direction DR1 of the connection line LN.

Therefore, the input pad PAD may be easily electrically connected through a conductive member CD to a contact pad CPD.

A plurality of partitions SP may be correspondingly disposed between the plurality of sensing lines CL. When viewed in a plan view, the plurality of partitions SP may not overlap the conductive member CD. The plurality of partitions SP may protrude in the third direction DR3 from the input pad PAD.

According to the present inventive concept, the plurality of partitions SP may prevent or substantially prevent the conductive member CD from contacting another conductive member CD that electrically connects the input pad PAD to an adjacent contact pad CPD. Therefore, an electrical short may be prevented or substantially prevented between neighboring input pads PAD.

Figure 10:
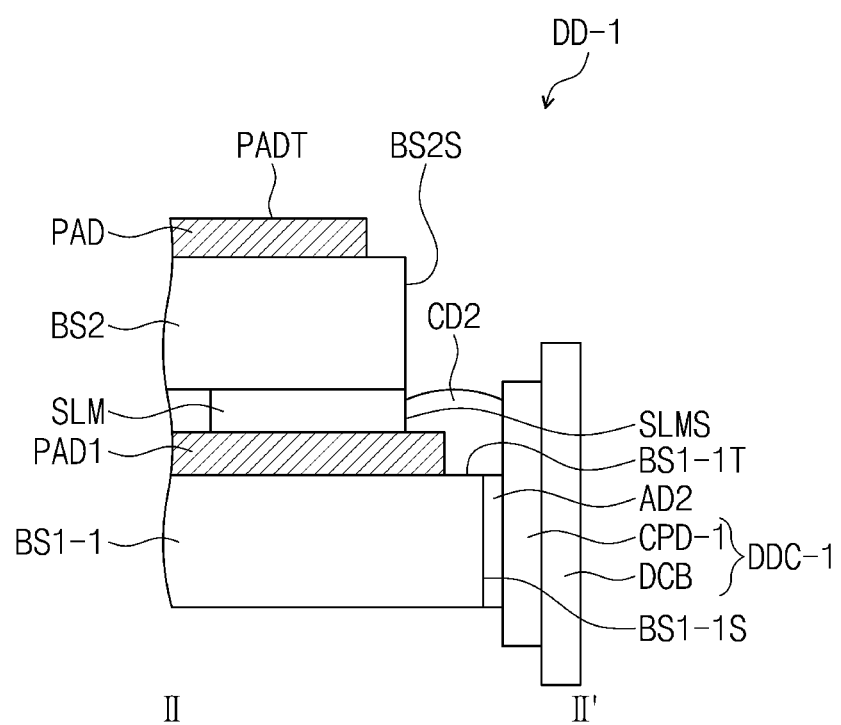
FIG. 10 illustrates a cross-sectional view taken along the line II-II' of FIG. 2, showing a display device according to some example embodiments of the present inventive concept.

FIG. 10 illustrates a cross-sectional view taken along the line II-II' of FIG. 2, showing a display device according to some example embodiments of the present inventive concept.

Referring to FIG. 10, a first base substrate BS1-1 may protrude in the second direction DR2 beyond the lateral surface BS2S of the second base substrate BS2. A display pad PAD1 may be disposed on the first base substrate BS1-1. The display pad PAD1 may be a portion of the display circuit layer (see MLD of FIG. 3A).

The display pad PAD1 may be called a pad.

A first circuit film DDC-1 may be coupled to a lateral surface BS1-1S of the first base substrate BS1-1. According to the present inventive concept, the first circuit film DDC-1 may be disposed below the top surface PADT of the input pad PAD. Therefore, the first circuit film DDC-1 may be prevented or substantially prevented from being damaged due to components disposed on the display module (see DM of FIG. 2) of the display device (see DD of FIG. 1).

The first circuit film DDC-1 may include a contact pad CPD-1 and a driver circuit board DCB.

The contact pad CPD-1 may be spaced apart in the second direction DR2 from the display pad PAD1. The contact pad CPD-1 may protrude beyond a top surface BS1-1T of the first base substrate BS1-1.

The driver circuit board DCB may be electrically connected to the contact pad CPD-1. The driver circuit board DCB may be a flexible circuit film. For example, the driver circuit board DCB may be bent from the lateral surface CM-DM to the bottom surface of the display module DM shown in FIG. 2. This, however, is merely an example, and no limitation is imposed on the driver circuit board DCB according to some example embodiments of the present inventive concept. For example, the driver circuit board DCB may be a rigid board.

A conductive member CD2 may be disposed on an adhesive member AD2, the display pad PAD1, and the top surface BS1-1T of the first base substrate BS1-1. The conductive member CD2 may electrically connect the display pad PAD1 to the contact pad CPD-1. The conductive member CD2 may contact the lateral surface SLMS of the sealing member SLM.

According to the present inventive concept, the adhesive member AD2 may allow the contact pad CPD-1 of the first circuit film DDC-1 to adhere to the lateral surface CM-DM of the display module DM. The display pad PAD1 and the contact pad CPD-1 may be electrically connected to each other through the conductive member CD2. Therefore, it may be possible to provide a display device DD-1 including a bezel having a reduced area.

Figure 11:
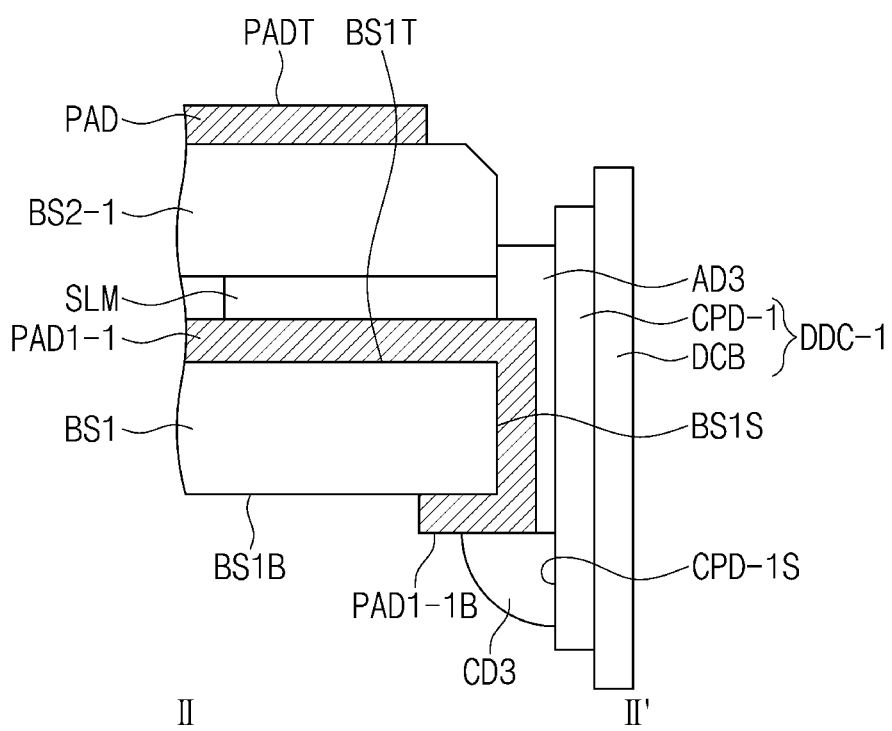
FIG. 11 illustrates a cross-sectional view taken along the line II-II' of FIG. 2, showing a display device according to some example embodiments of the present inventive concept.
Figure 11:
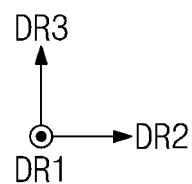

FIG. 11 illustrates a cross-sectional view taken along the line II-II' of FIG. 2, showing a display device according to some example embodiments of the present inventive concept.

Referring to FIG. 11, a display pad PAD1-1 may be disposed on a top surface BS1T, a lateral surface BS1S, and a bottom surface BS1B of the first base substrate BS1. The display pad PAD1-1 may have a continuous shape.

An adhesive member AD3 may couple the display pad PAD1-1 to the first circuit film DDC-1.

A conductive member CD3 may contact a bottom surface PAD1-1B of the display pad PAD1-1 and a lateral surface CPD-1S of the contact pad CPD-1. The conductive member CD3 may electrically connect the display pad PAD1-1 to the contact pad CPD-1.

According to the present inventive concept, the first circuit film DDC-1 may not protrude beyond the top surface PADT of the input pad PAD. The first circuit film DDC-1 may be prevented or substantially prevented from being damaged due to components disposed on the display module (see DM of FIG. 2) of the display device (see DD of FIG. 1).

According to the present inventive concept, the display pad PAD1-1 may be disposed to extend from the top surface BS1T to the bottom surface BS1B of the first base substrate BS1. The display pad PAD1-1 may have an increased area and a decreased resistance. It may be possible to increase reliability of signals transferred from the display pad PAD1-1 to the first circuit film DDC-1.

Figure 12:
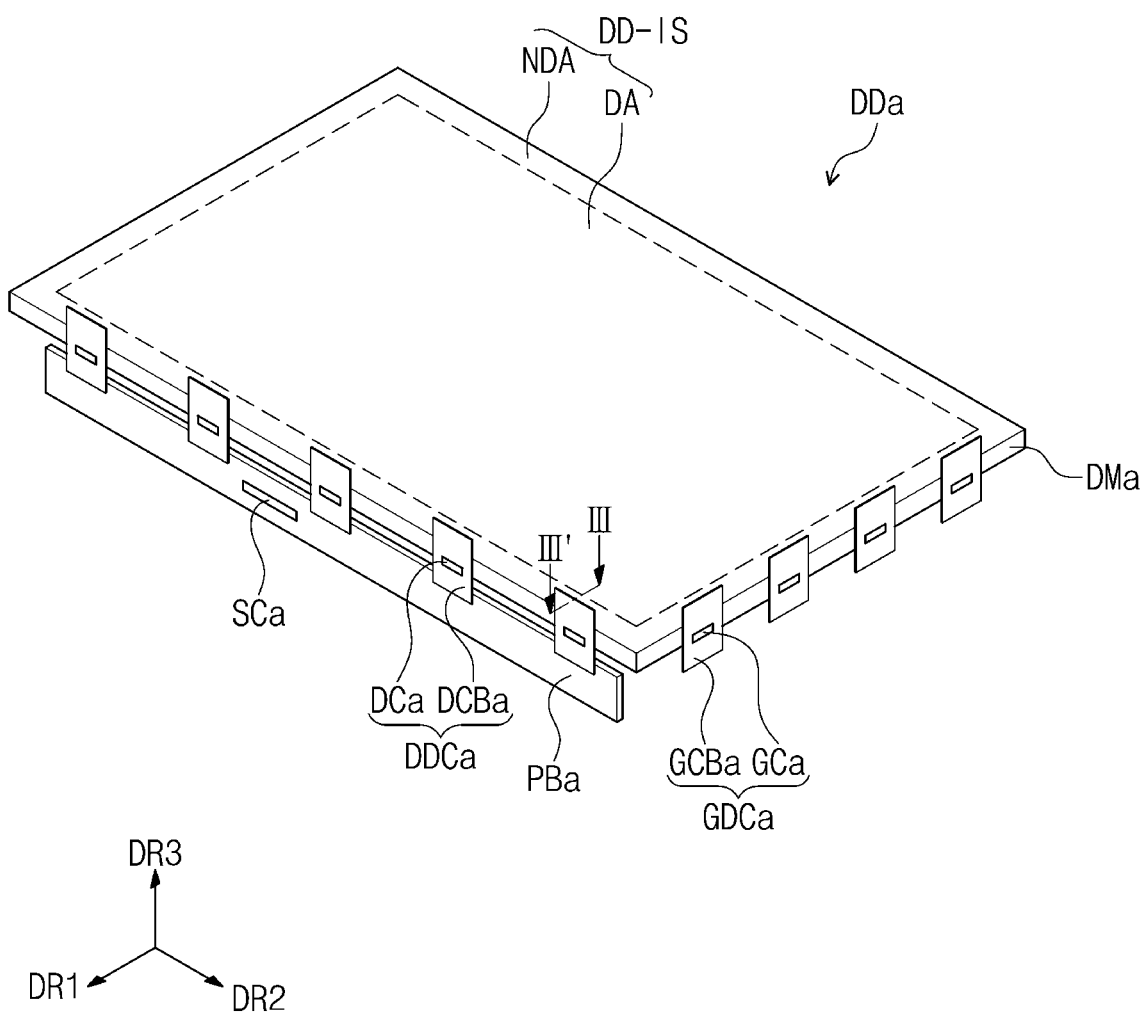
FIG. 12 illustrates a perspective view showing a display device according to some example embodiments of the present inventive concept.

FIG. 12 illustrates a perspective view showing a display device according to some example embodiments of the present inventive concept. The same reference symbols are allocated to the components discussed in FIG. 1, and a repetitive description thereof may be omitted.

FIG. 12 shows a large-sized display device DDa. The display device DDa may include a display module DMa, a gate driver film GDCa, a circuit film DDCa, a main circuit board PBa, and a signal controller SCa.

The gate driver film GDCa may include a gate circuit board GCBa and a driver chip GCa. The circuit film DDCa may include a driver circuit board DCBa and a driver chip DCa. The circuit boards GCBa and DCBa may each have a structure in which a dielectric layer and a conductive layer are stacked. The conductive layer may include a plurality of signal lines.

According to the present inventive concept, the gate driver film GDCa and the circuit film DDCa may be coupled to lateral surfaces of the display module DMa, and thus may have electrical connections with signal lines of the display module DMa. The non-display region NDA may be reduced due to the coupling of the gate driver film GDCa and the circuit film DDCa to the lateral surfaces of the display module DMa. Accordingly, the display device DDa including a bezel having a reduced area may be provided.

FIG. 12 depicts by way of example that the gate driver film GDCa and the circuit film DDCa are coupled to different lateral surfaces of the display module DMa, but in some example embodiments of the present inventive concept, one of the films GDCa and DDCa may be omitted. In an embodiment, the gate driver film GDCa and the circuit film DDCa may be disposed on the same lateral surface of the display module DMa. In an embodiment, either an oxide silicon gate driver circuit (OSG) process or an amorphous silicon grate driver circuit (ASG) process may be employed to integrate the gate driver film GDCa on the display module DMa.

In some example embodiments of the present inventive concept, the display device DDa may further include another main circuit board that is connected to the gate circuit board GCBa of the gate driver film GDCa.

In some example embodiments of the present inventive concept, the driver chip DCa of the circuit film DDCa may be mounted on the main circuit board PBa.

Figure 13:
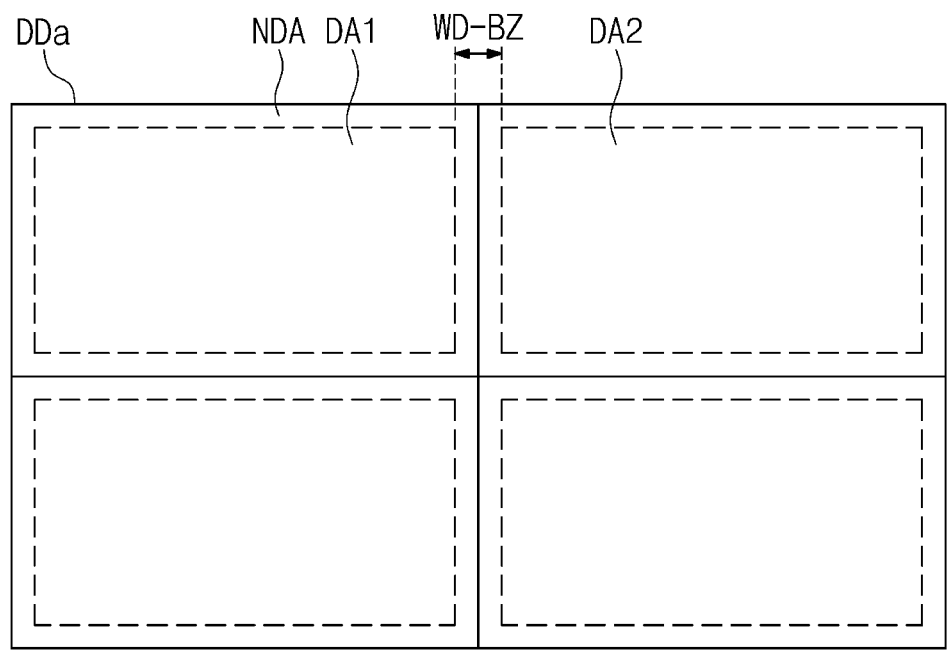
FIG. 13 illustrates a plan view showing a plurality of display devices according to some example embodiments of the present inventive concept.
Figure 13:
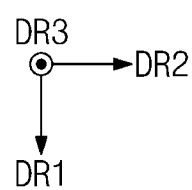

FIG. 13 illustrates a plan view showing a plurality of display devices according to some example embodiments of the present inventive concept.

Referring to FIG. 13, a plurality of display devices DDa may be disposed adjacent to each other. The display device DDa according to some example embodiments of the present inventive concept may have a small bezel area, and, thus, the non-display region NDA may be reduced. The non-display regions NDA of two neighboring display devices DDa may have a small width WD-BZ therebetween.

The non-display region NDA may not be externally visible to a user.

Accordingly, a user may recognize a first display region DA1 and a second display region DA2 as a single display region.

Figure 14:
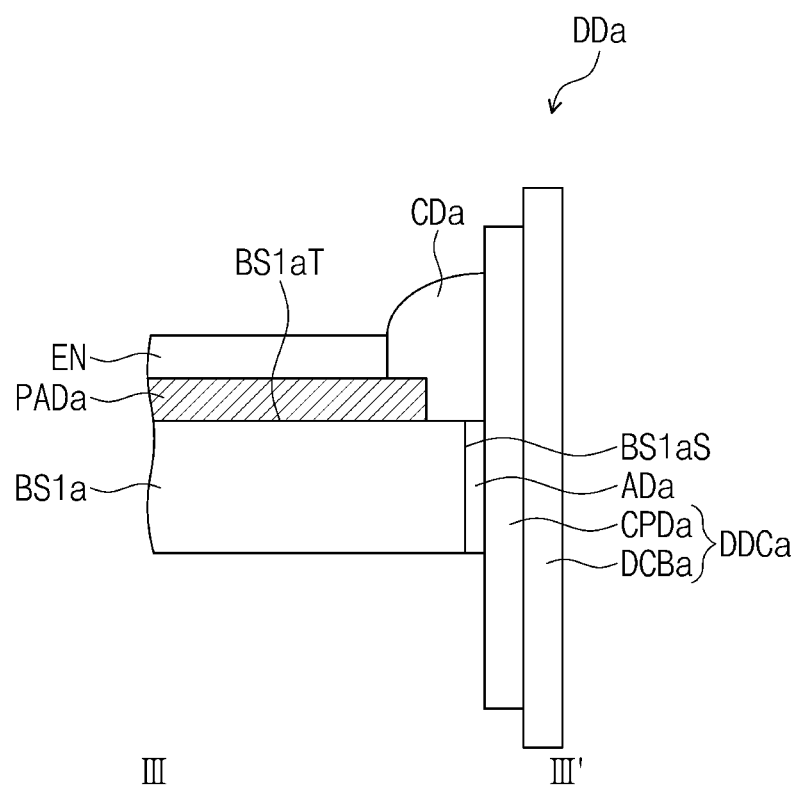
FIG. 14 illustrates a cross-sectional view taken along the line III-III' of FIG. 12, showing a display device according to some example embodiments of the present inventive concept.

FIG. 14 illustrates a cross-sectional view taken along the line III-III' of FIG. 12, showing a display device according to some example embodiments of the present inventive concept.

Referring to FIG. 14, the display device DDa may include a display module (see DMa of FIG. 12), a circuit film DDCa, a conductive member CDa, and an adhesive member ADa.

A display pad PADa may be disposed on a top surface BS1$a$T of a base substrate BS1$a$. The base substrate BS1$a$ may be referred to as a first base substrate. The display pad PADa may be a portion of the display circuit layer (see MLD of FIG. 3A).

An encapsulation layer EN may be disposed on the display pad PADa.

The circuit film DDCa may be coupled to a lateral surface BS1$a$S of the base substrate BS1$a$. The circuit film DDCa may further include a contact pad CPDa.

The contact pad CPDa may be spaced apart in the first direction DR1 from the display pad PADa. In an embodiment, the contact pad CPDa may protrude beyond the top surface BS1$a$T of the base substrate BS1$a$.

A driver circuit board DCBa may be electrically connected to the contact pad CPDa. In an embodiment, the driver circuit board DCBa may be a flexible circuit board. For example, the driver circuit board DCBa may be bent from a lateral surface of the display module DMa to a bottom surface of the display module DMa. This, however, is merely an example, and no limitation is imposed on the driver circuit board DCBa according to some example embodiments of the present inventive concept. For example, the driver circuit board DCBa may be a rigid board.

The conductive member CDa may be disposed on the adhesive member ADa, the display pad PADa, and the top surface BS1$a$T of the base substrate BS1$a$. The conductive member CDa may contact the display pad PADa and the contact pad CPDa. The conductive member CDa may electrically connect the display pad PADa to the contact pad CPDa.

The adhesive member ADa may couple the contact pad CPDa to the lateral surface BS1$a$S of the base substrate BS1$a$. In an embodiment, the adhesive member ADa may include a conventional adhesive or glue.

According to the present inventive concept, the adhesive member ADa may couple the contact pad CPDa of the circuit film DDCa to the lateral surface of the display module DMa. The display pad PADa and the contact pad CPDa may be electrically connected to each other through the conductive member CDa. Accordingly, the display device DDa may be provided with a reduced bezel area.

In addition, according to the present inventive concept, because the display pad PADa is neither disposed to extend onto the lateral surface BS1$a$S of the base substrate BS1$a$ nor coupled to the contact pad CPDa, a pad crack may be prevented or substantially prevented from occurring at a corner that connects the top surface BS1$a$T to the lateral surface BS1$a$S of the base substrate BS1$a$. Therefore, it may be possible to increase reliability of connection between the display pad PADa and the contact pad CPDa.

Figure 15:
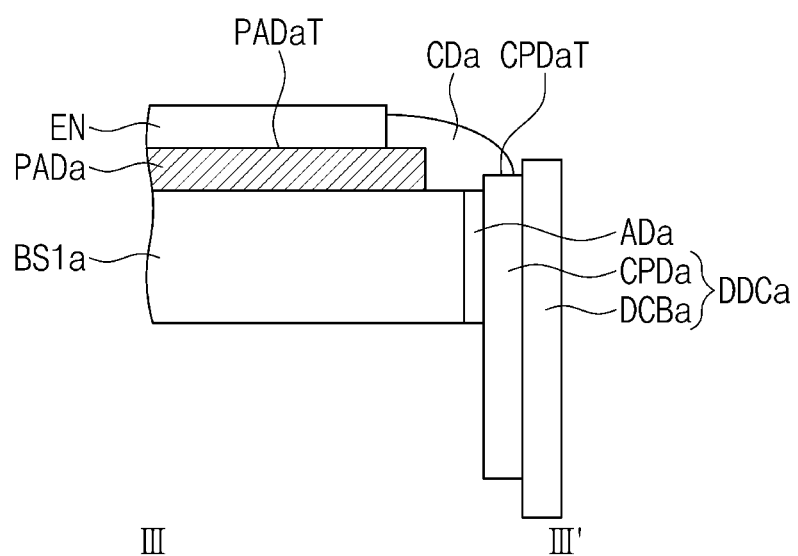
FIG. 15 illustrates a cross-sectional view taken along the line III-III' of FIG. 12, showing a display device according to some example embodiments of the present inventive concept.

FIG. 15 illustrates a cross-sectional view taken along the line III-III' of FIG. 12, showing a display device according to some example embodiments of the present inventive concept. In describing FIG. 15, the same reference symbols are allocated to the components discussed in FIG. 14, and a repetitive description thereof may be omitted.

Referring to FIG. 15, in an embodiment, the circuit film DDCa may be disposed below a top surface PADaT of the display pad PADa.

According to the present inventive concept, the circuit film DDCa may not protrude beyond the top surface PADaT of the display pad PADa. The circuit film DDCa may be prevented or substantially prevented from being damaged due to components disposed on the display module DMa of the display device DDa shown in FIG. 12.

The conductive member CDa may contact the display pad PADa, the base substrate BS1$a$, and the contact pad CPDa. The conductive pad CDa may contact a top surface CPDaT of the contact pad CPDa. The conductive member CDa may electrically connect the display pad PADa to the contact pad CPDa.

Figure 16:
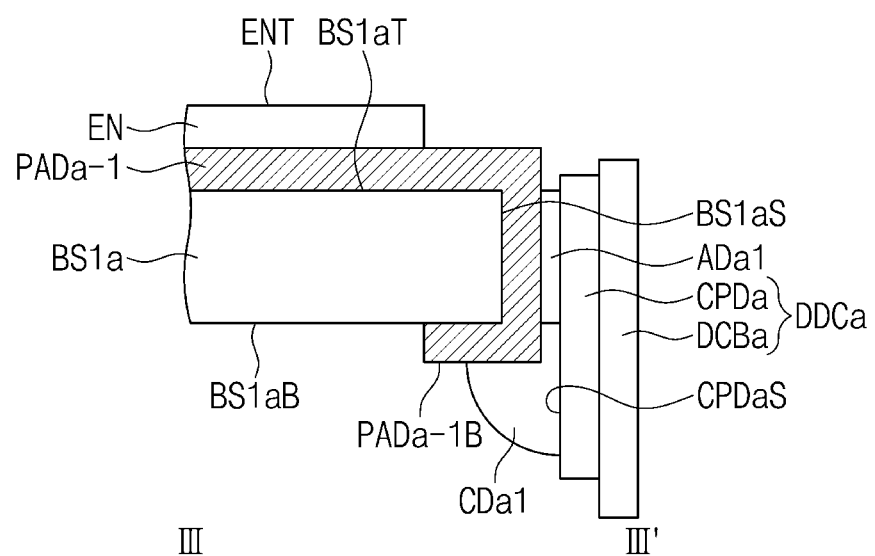
FIG. 16 illustrates a cross-sectional view taken along the line III-III' of FIG. 12, showing a display device according to some example embodiments of the present inventive concept.

FIG. 16 illustrates a cross-sectional view taken along the line III-III' of FIG. 12, showing a display device according to some example embodiments of the present inventive concept. In describing FIG. 16, the same reference symbols are allocated to the components discussed in FIG. 14, and a repetitive description thereof may be omitted.

Referring to FIG. 16, a display pad PADa-1 may be disposed on a top surface BS1$a$T, a lateral surface BS1$a$S, and a bottom surface BS1$a$B of the base substrate BS1$a$. The display pad PADa-1 may have a continuous shape.

An adhesive member ADa1 may couple the display pad PADa-1 to the circuit film DDCa.

A conductive member CDa1 may contact a bottom surface PADa-1B of the display pad PADa-1 and a lateral surface CPDaS of the contact pad CPDa. The conductive member CDa1 may electrically contact the display pad PADa-1 to the contact pad CPDa.

According to the present inventive concept, the circuit film DDCa may not protrude beyond a top surface ENT of the encapsulation layer EN. The circuit film DDCa may be prevented or substantially prevented from being damaged due to components disposed on the display module DMa of the display device DDa shown in FIG. 12.

According to the present inventive concept, the display pad PADa-1 may be disposed to extend from the top surface BS1$a$T to the bottom surface BS1$a$B of the base substrate BS1$a$. The display pad PADa-1 may have an increased area and may thus have a decreased resistance. It may be possible to increase reliability of signals transferred from the display pad PADa-1 to the circuit film DDCa.

According to embodiments of the present inventive concept, a plurality of circuit films may be disposed on a lateral surface of a display module. In comparison with a display device in which a plurality of circuit films are disposed on a top or bottom surface of a display module, a display device according to embodiments of the present inventive concept may have a reduced dead space.

According to embodiments of the present inventive concept, a pad crack may be prevented or substantially prevented from occurring at a corner that connects a top surface of a base substrate to a lateral surface of the base substrate. Accordingly, it may be possible to increase reliability of connection between a pad and a contact pad.

According to embodiments of the present inventive concept, because the pad is spaced apart from the lateral surface of the base substrate, the pad may be prevented or substantially prevented from the occurrence of crack due to external impact. Therefore, it may be possible to increase reliability of connection between the pad and the contact pad.

Although the embodiments have been described with reference to a number of illustrative examples thereof, it will be understood by those of ordinary skill in the art that various changes in form and details may be made without departing from the spirit and scope of the present inventive concept as set forth in the following claims. Thus, the technical scope of the present inventive concept is not limited by the embodiments and examples described above.

What is claimed is:

1. A display device, comprising:
   a display module comprising a first base substrate and a pad on a top surface of the first base substrate;
   a circuit film coupled to a lateral surface of the first base substrate, the circuit film comprising:
      a contact pad comprising a first lateral surface facing the lateral surface of the first base substrate and spaced apart from the pad, and a second lateral surface opposite to the first lateral surface; and
      an input circuit board contacting an entirety of the second lateral surface of the contact pad; and
   a conductive member contacting the top surface of the first base substrate and having a distal end directly contacting, and terminating at, the first lateral surface of the contact pad or a top surface of the contact pad that is substantially perpendicular to the first lateral surface and the second lateral surface, the conductive member having an external curved surface.

2. The display device of claim 1, wherein the contact pad protrudes upwardly beyond the top surface of the first base substrate.

3. The display device of claim 1, wherein the conductive member is in contact with the top surface of the contact pad.

4. The display device of claim 1, wherein the first base substrate has a chamfered surface at a corner between the top surface of the first base substrate and the lateral surface of the first base substrate.

5. The display device of claim 4, wherein the conductive member is in contact with the chamfered surface.

6. The display device of claim 1, further comprising a plurality of partitions that are spaced apart from each other across the pad,
   wherein, when viewed in a plan view, the plurality of partitions does not overlap the conductive member.

7. The display device of claim 1, further comprising an adhesive member coupling the contact pad to the lateral surface of the first base substrate.

8. The display device of claim 7, further comprising:
   a second base substrate below the first base substrate; and
   a sealing member between the first base substrate and the second base substrate,
   wherein a lateral surface of the sealing member and a lateral surface of the second base substrate are coupled to the adhesive member.

9. The display device of claim 7, further comprising:
   a second base substrate on the first base substrate; and
   a sealing member between the first base substrate and the second base substrate,
   wherein the first base substrate protrudes beyond a lateral surface of the second base substrate.

10. The display device of claim 9, wherein the conductive member is in contact with a lateral surface of the sealing member.

11. The display device of claim 7, wherein a width in a first direction of the adhesive member is less than a width in the first direction of the contact pad.

12. The display device of claim 7, wherein, when viewed in a plan view, the conductive member overlaps the pad, the first base substrate, and the adhesive member.

13. The display device of claim 1, wherein a thickness of the first base substrate is less than a width of the contact pad, the width of the contact pad being in a direction parallel to a thickness direction of the first base substrate.

14. A display device, comprising:
   a display module comprising a first base substrate and a pad on a top surface of the first base substrate;
   a circuit film coupled to a lateral surface of the first base substrate, the circuit film comprising:
      a contact pad comprising a first lateral surface facing the lateral surface of the first base substrate and spaced apart from the pad, and a second lateral surface opposite to the first lateral surface; and
      an input circuit board contacting an entirety of the second lateral surface of the contact pad; and
   a conductive member on the top surface of the first base substrate and having a distal end directly contacting, and terminating at, the first lateral surface of the contact pad or a top surface of the contact pad that is substantially perpendicular to the first lateral surface and the second lateral surface, the conductive member having an external curved surface,
   wherein the conductive member is in contact with the top surface of the contact pad, and
   wherein an entirety of the contact pad is below a height that is even with a top surface of the pad.

15. A display device, comprising:
   a display module comprising a substrate and a pad on a top surface of the substrate;
   a circuit film coupled to a lateral surface of the display module, the circuit film comprising:
      a contact pad comprising a first lateral surface facing the lateral surface of the display module, and a second lateral surface opposite to the first lateral surface; and
      an input circuit board contacting an entirety of the second lateral surface of the contact pad;
   an adhesive member coupled to the contact pad and the lateral surface of the display module; and
   a conductive member electrically connecting the pad to the contact pad by having a distal end terminating at the first lateral surface of the contact pad, or at a top surface of the contact pad that is substantially perpendicular to the first lateral surface and the second lateral surface, the conductive member having an external curved surface, and being above the pad, the substrate, and the adhesive member.

16. The display device of claim 15, wherein the contact pad protrudes upwards beyond the top surface of the substrate, and
   wherein the conductive member is in contact with a top surface of the pad and a lateral surface of the contact pad.

17. The display device of claim 15, wherein the circuit film is below a top surface of the pad, and wherein the conductive member is in contact with the top surface of the pad and the top surface of the contact pad.

18. The display device of claim 15, wherein a thickness of the substrate is less than a width of the contact pad, the width of the contact pad being in a direction parallel to a thickness direction of the substrate.

19. The display device of claim 18, wherein the width of the contact pad is greater than a width of the adhesive member, the width of the adhesive member being in the direction parallel to the thickness direction of the substrate.

* * * * *